United States Patent
Wang et al.

(10) Patent No.: US 6,751,146 B1
(45) Date of Patent: Jun. 15, 2004

(54) SYSTEM AND METHOD FOR CHARGE RESTORATION IN A NON-VOLATILE MEMORY DEVICE

(75) Inventors: Zhigang Wang, Santa Clara, CA (US); Jianshi Wang, San Jose, CA (US); Imran Khan, Santa Clara, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/338,333

(22) Filed: Jan. 7, 2003

(51) Int. Cl.[7] .................................................. G11C 7/00
(52) U.S. Cl. ................ 365/222; 265/285.03; 265/85.09
(58) Field of Search ............................ 365/222, 185.03, 365/185.09, 185.24

(56) References Cited

U.S. PATENT DOCUMENTS 5,657,332 A * 8/1997 Auclair et al. .............. 714/763
6,049,497 A * 4/2000 Yero ........................... 365/222
6,240,032 B1 * 5/2001 Fukumoto ................... 365/222
6,307,776 B1 * 10/2001 So et al. .................. 365/185.03

* cited by examiner

Primary Examiner—Vu A. Le (57) ABSTRACT

A non-volatile memory device comprising logic for charge restoration. The restore logic controls a read circuit for determining a value associated with the threshold voltage of a memory cell selected from a memory cell array, and compares the value to one or more boundary values to determine whether or not the memory cell value is out of bounds. In the event that the memory cell value is out of bounds, a target value for the memory cell is established. The restore logic controls a write circuit that applies a write pulse to the memory cell. The read and write process is repeated as necessary until the target value for the memory cell is achieved. The restore logic may include a processor for performing a statistical analysis on the memory cell array in order to determine target restoration values. Memory cells within the array may be reserved for use by the restore logic.

20 Claims, 6 Drawing Sheets

SYSTEM AND METHOD FOR CHARGE RESTORATION IN A NON-VOLATILE MEMORY DEVICE

TECHNICAL FIELD

The present invention relates to a non-volatile memory. Specifically, the present invention relates to a system and method for restoring charge lost from a charge storage element in a non-volatile memory.

BACKGROUND ART

Many electronic devices, such as computers, personal digital assistants, cellular telephones, digital cameras and similar systems and devices include processors and memory. The memory is used to store computer programs to be executed by the device and/or data operated on by the processors to achieve the functionality of the device. Many devices and systems require that this information be retained in permanent storage/non-volatile medium so that the data and computer programs is not lost when power is removed.

Flash memory (or Flash RAM) is an example of a non-volatile memory device. Flash memory devices use a memory cell transistor with a floating gate structure. The typical memory cell in a flash memory device comprises an access transistor and a storage element, such as a floating gate. Data in the flash memory device are programmed or erased by accumulation or depletion of charge, respectively, across a thin insulating film between a substrate and a storage element (e.g., floating gate). Programming of the memory cells occurs by applying a sufficient voltage difference to the transistors to cause excess electrons to accumulate on the storage element. Erasure of the memory cell is done by applying a voltage difference that causes the charge on the storage element to be extracted.

Figure 1A:
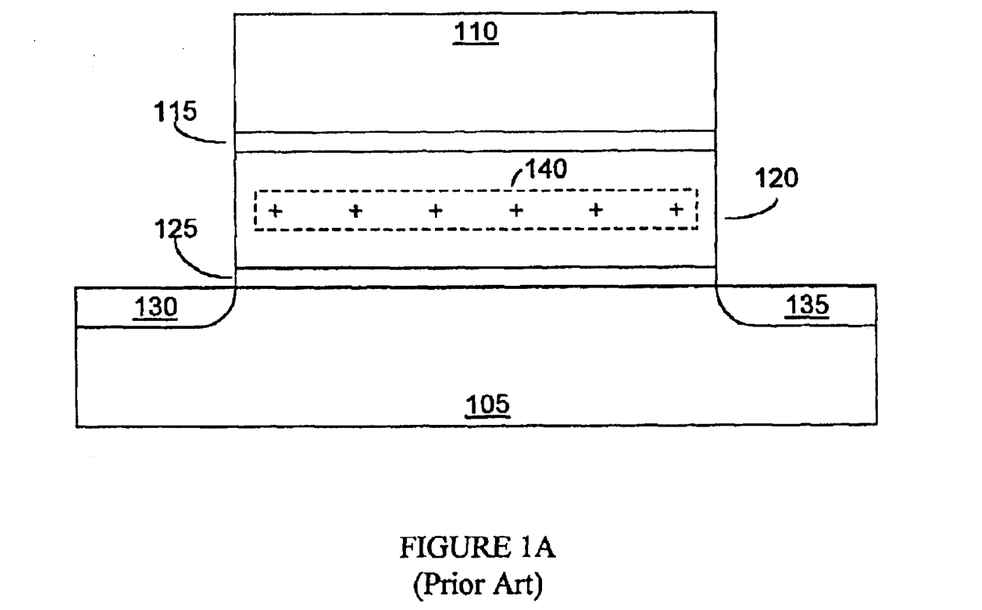
FIG. 1A shows a diagram of a non-volatile memory cell with a floating gate.

Prior Art FIG. 1A shows a diagram of a typical memory cell with a floating gate 120. A source 130 and drain 135 are fabricated in a substrate 105, and separated from the floating gate 140 by an oxide 125. The control gate 110 is separated from the floating gate by an oxide 115. In writing to the memory cell, a charge 140 is transferred across the oxide 125 into the floating gate 140. The charge transfer may be effected by either Fowler-Nordheim tunneling or channel hot electron injection. The memory cell of FIG. 1A may be used to store multiple bits of information by injecting different amounts of charge. In the floating gate, the charge is mobile and not localized.

Figure 1B:
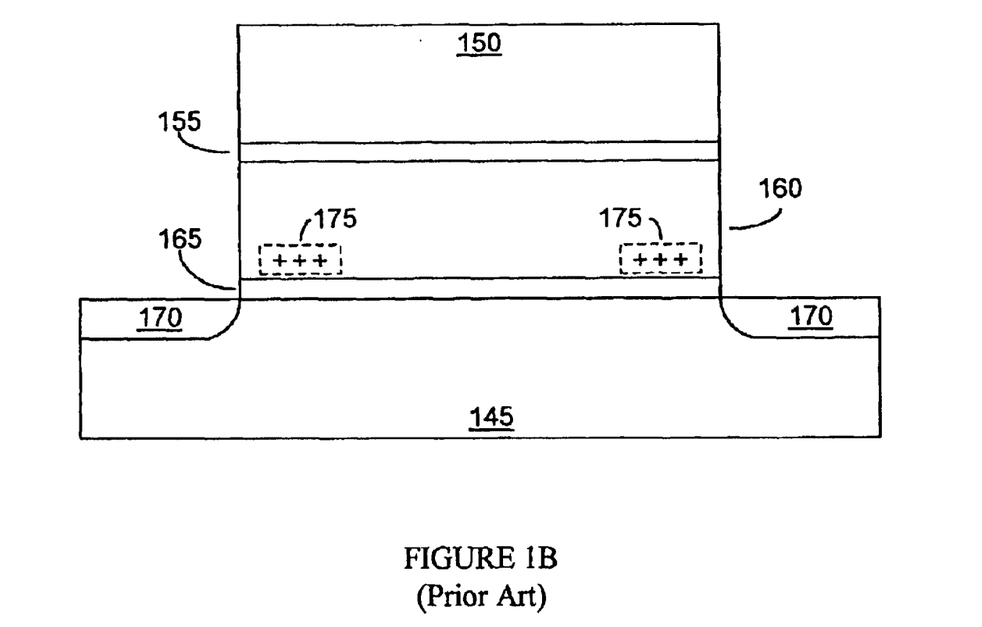
FIG. 1B shows a diagram of a non-volatile memory cell with a dielectric charge storage element.

Prior Art FIG. 1B shows a diagram of another memory cell structure that replaces the floating gate 140 of FIG. 1A with a dielectric storage element 160. The dielectric storage element 160 may be injected with two distinct charges 175, each located near a symmetric drain/source 170. In contrast to the floating gate in which different bits (or combinations of bits) are associated with a charge level, the dielectric charge storage element provides for the representation of bits through discrete localized charges. The control gate 150, oxide 155, oxide 165 and substrate 145 are similar to the control gate 110, oxide 115, oxide 125 and substrate 105 of FIG. 1A.

Figure 2:
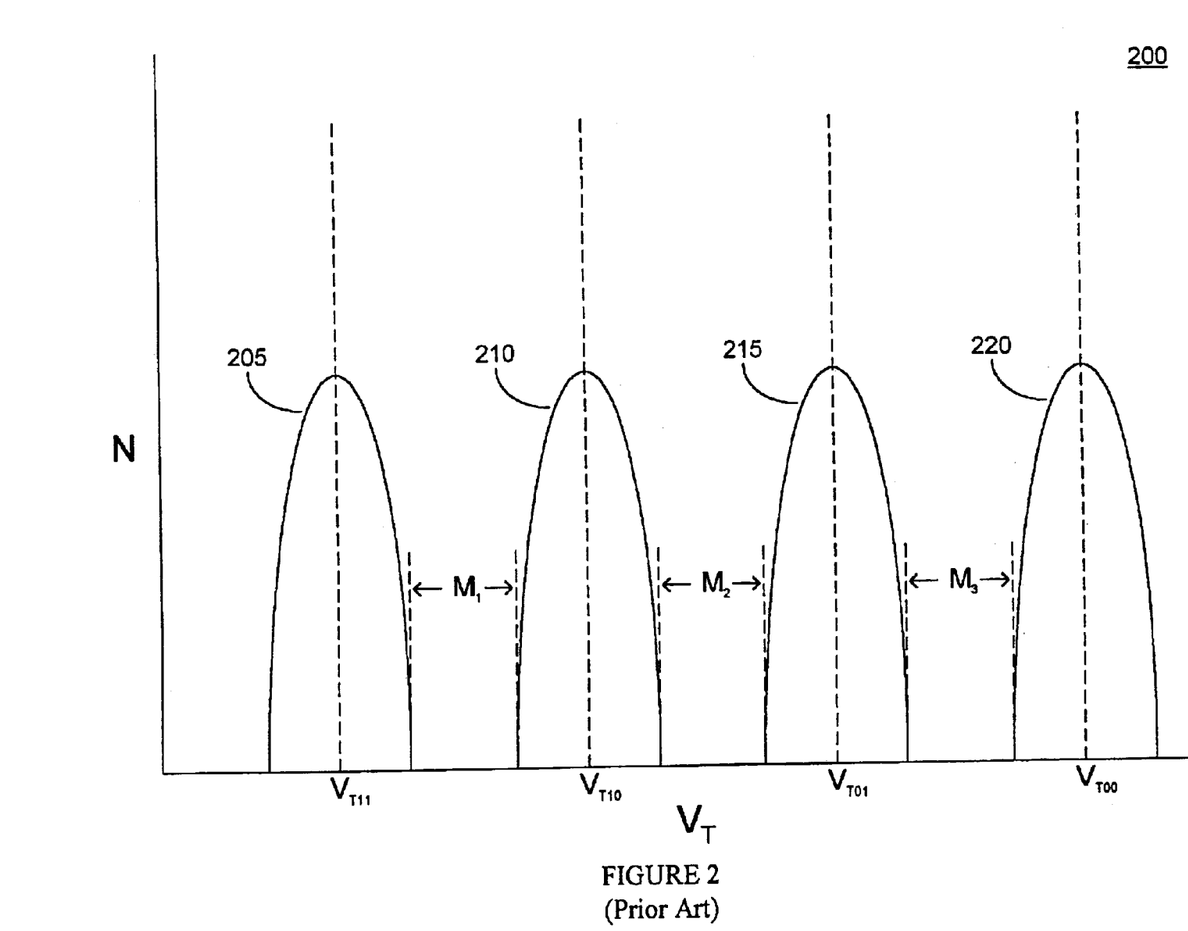
FIG. 2 shows a schematic for a typical threshold distribution for a two-bit multi-level memory cell.

Prior Art FIG. 2 shows a diagram 200 for the threshold voltage of a multi-level (or multi-bit) memory cell array. The example shown in FIG. 2 corresponds to a two-bit memory cell that has four nominal threshold voltages ($V_{T11}$, $V_{T10}$, $V_{T01}$, and $V_{T00}$,) associated with four possible logical bit combinations (11, 10, 01, and 00). The association between logical values and threshold values is arbitrary. In a memory cell array, or large population of memory cells, each group of cells associated with a logical value will have a distribution of threshold values distributed about the nominal threshold value ($V_T$). Distributions 205, 210, 215, and 220 correspond to threshold voltages $V_{T11}$, $V_{T10}$, $V_{T01}$, and $V_{T00}$, respectively. N represents the number of cells as a function of the threshold voltage $V_T$.

In order for the logical values in a multi-level memory cell to be distinguishable, they must be separated by a read margin M. In the multi-level example of FIG. 2, distributions 205 and 210 are separated by read margin $M_1$, distributions 210 and 215 by $M_2$, and distributions 215 and 220 by $M_3$. The width of the distribution for a threshold voltage is in part a function of geometry and process variations, and defects.

A fundamental difference between dynamic random access memory (DRAM) and similar memory types is that non-volatile memory cells such as those shown in FIGS. 1A and 1B is that they are programmed by transferring charge across a dielectric layer, whereas DRAM memory cells are programmed by charging a capacitor through a transistor switch. The leakage characteristic of DRAM cells requires that the cells be refreshed on a regular basis, whereas non-volatile memory cells are designed to maintain their programmed state virtually indefinitely, without refresh, hence the name "non-volatile memory."

Although fundamental properties of the materials used to fabricate non-volatile memory cells provide a basis for fabricating highly stable non-volatile memory devices, the quest for smaller device geometries and higher information densities has resulted in a reduction in the margin of stability for many devices at high write/erase cycle counts and at high temperatures. This trend is expected to continue as critical dimensions for photolithographic processes continue to decrease, and thinner films arc employed to reduce working voltages.

Even high quality dielectric films are susceptible to tunneling and thermally assisted conduction if they are made thin enough, and charge losses that were previously expected to occur on a geologic time scale, even at elevated temperatures, are now within the realm of normal operating conditions and lifetimes. The loss of ability of a memory cell to retain charge is manifested in shifting threshold voltages and compromised read margins. What is needed is a method for offsetting threshold voltage shifts and maintaining read margins.

DISCLOSURE OF THE INVENTION

A non-volatile memory device comprising logic for charge restoration is disclosed. The restore logic controls a read circuit for determining a value associated with the threshold voltage of a memory cell selected from a memory cell array, and compares the value to one or more boundary values to determine whether or not the memory cell value is out of bounds. In the event that the memory cell value is out of bounds, a target value for the memory cell is established. The restore logic controls a write circuit that applies a write pulse to the memory cell. The read and write process is repeated as necessary until the target value for the memory cell is achieved. The restore logic may include a processor for performing a statistical analysis on the memory cell array in order to determine target restoration values. Memory cells within the array may be reserved for use by the restore logic.

In a method embodiment of the present invention, boundary values are established for the allowable range of threshold voltages associated with each logical value of a memory cell. These boundary values define the read margins between logical values/threshold voltage values for the memory cell, and are related to the distribution of threshold voltages for the population (e.g., array) to which the memory cell belongs. Periodically, a memory cell is selected from the array and read to determine a value. The read value is compared to at least one boundary to determine whether the cell value has drifted into a margin. In the event that the memory cell value has drifted into a margin, a write procedure is performed to push the cell threshold value back across the boundary.

In another embodiment of the present invention, a non-volatile memory device includes restore logic coupled to read and write circuits for sensing and altering the state of memory cells belonging to an array of memory cells. The read and write circuits are coupled to decoder circuits for selecting a memory cell from the array of memory cells. The restore logic may include a processor for performing a statistical analysis on the memory cell array. Certain memory cells within the memory cell array may be reserved for use by the restore logic.

BRIEF DESCRIPTION OF THE DRAWINGS

Prior Art

Prior Art

Prior Art

BEST MODES FOR CARRYING OUT THE INVENTION

Reference will now be made in detail to the preferred embodiments of the present invention, a system and method for charge restoration in a non-volatile memory device. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Figure 3A:
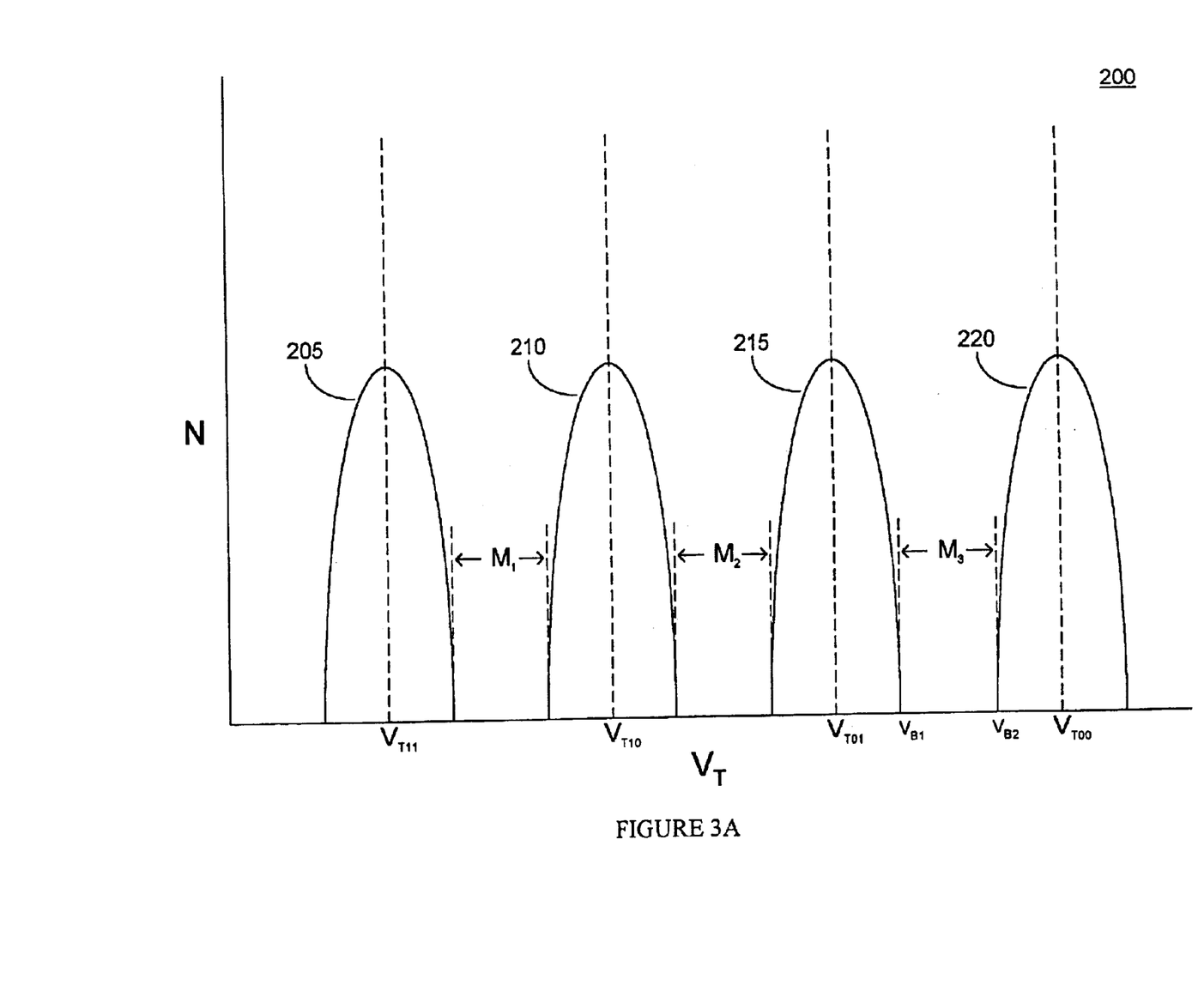
FIG. 3A shows a schematic for a typical threshold voltage distribution for a two-bit multi-level memory cell with margin boundary values assigned in accordance with an embodiment of the present claimed invention.
Figure 3B:
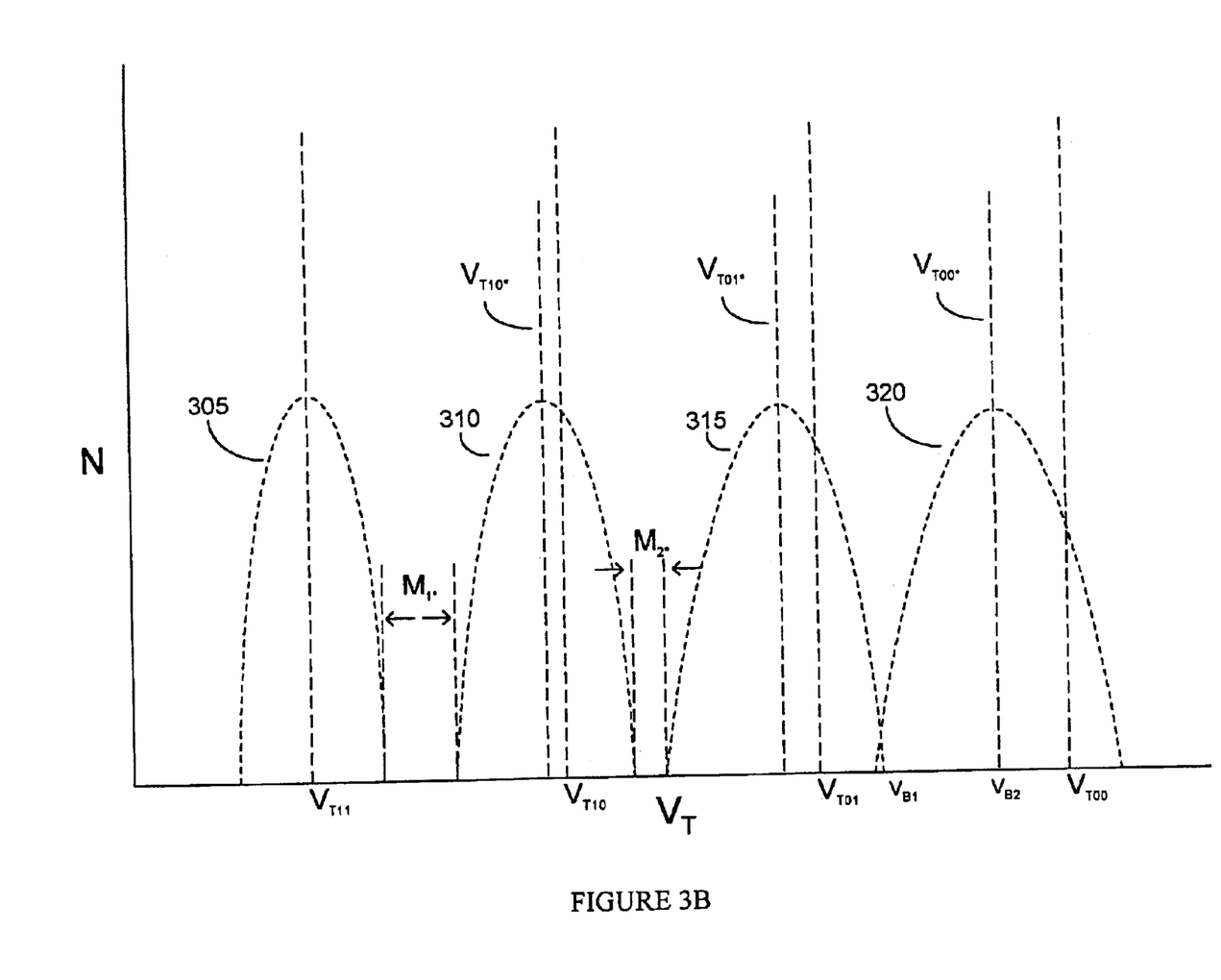
FIG. 3B shows a schematic of an altered threshold voltage distribution based upon the threshold voltage distribution of FIG. 3A.

FIG. 3A shows a schematic for a typical threshold voltage distribution for a two-bit multi-level memory cell with margin boundary values $V_{B1}$ and $V_{B2}$ assigned in accordance with an embodiment of the present invention. $V_{B1}$ represents the upper boundary value for threshold distribution 215, and $V_{B2}$ represents the lower boundary value for threshold voltage distribution 220. Each of the threshold voltages 205, 210, 215, and 220 may be assigned upper and/or lower boundary values. $V_{B1}$ and $V_{B2}$ establish the desired margin $M_3$. In this example, $V_{B1}$ and $V_{B2}$ are each placed at an edge of a threshold voltage distribution (215 and 220, respectively), which may be an expected distribution or an observed distribution. In general, $V_{B1}$ and $V_{B2}$ are not necessarily placed at a distribution edge. The memory cell underlying the example of FIG. 3 is capable of storing four logical values (00, 01, 10, and 11). In this example, "11" represents the unprogrammed cell and "00" represents the highest program level (greatest charge level). Each logical value has an associated voltage threshold ($V_T$) $V_{T11}$, $V_{T10}$, $V_{T01}$, and $V_{T00}$, with a corresponding FIG. 3B shows an example of an altered threshold voltage distribution based upon the threshold voltage distribution of FIG. 3A. The fundamental cause for the alteration shown in FIG. 3B is charge loss, and there are many mechanisms that can contribute to charge loss from a floating gate or dielectric storage element. Time, temperature and the number of write/erase cycles are factors that influence charge loss. Increased temperature results in increased energy in electrons constituting the programmed charge, as well as degraded properties in the dielectric films of a memory cell. However, under normal operating conditions, time and temperature alone may not cause significant charge loss.

The number of write/erase cycles experienced by a memory cell increases the susceptibility of a memory cell to charge loss through the introduction of defects in the dielectric films that isolate the floating gate or charge storage element. These defects are associated with injection and extraction of energetic electrons during the write and erase processes. Large write/erase cycle counts reduce the time and temperature windows for charge retention.

Threshold voltage distributions 305, 310, 315, and 320 of FIG. 3A show the effect of charge loss in a multi-level memory cell. Distribution 305 corresponds to the unprogrammed state, and as such shows no change with respect to distribution 205 of FIG. 3A. However, each of the distributions 310, 315, and 320 show the effects of lost program charge as compared to distributions 210, 215, and 220, respectively. Each of the altered distributions distributions 310, 315, and 320 exhibits a shift to a lower threshold voltage ($V_{T10^*}$, $V_{T01^*}$, and $V_{T00^*}$, respectively). The distributions also experience a broadening and a lowered peak in the curve.

The charge loss induced alteration of the threshold voltage distributions results in a reduction of the read margin between states in the memory cell. Read Margin $M_{1^*}$ and $M_{2^*}$ are smaller than $M_1$ and $M_2$, and the read margin (formerly $M_3$) between distributions 315 and 320 has vanished due to overlap between distributions 315 and 320. Thus, the logical values "01" and "00" can no longer be reliably determined for the memory cell array.

Figure 4:
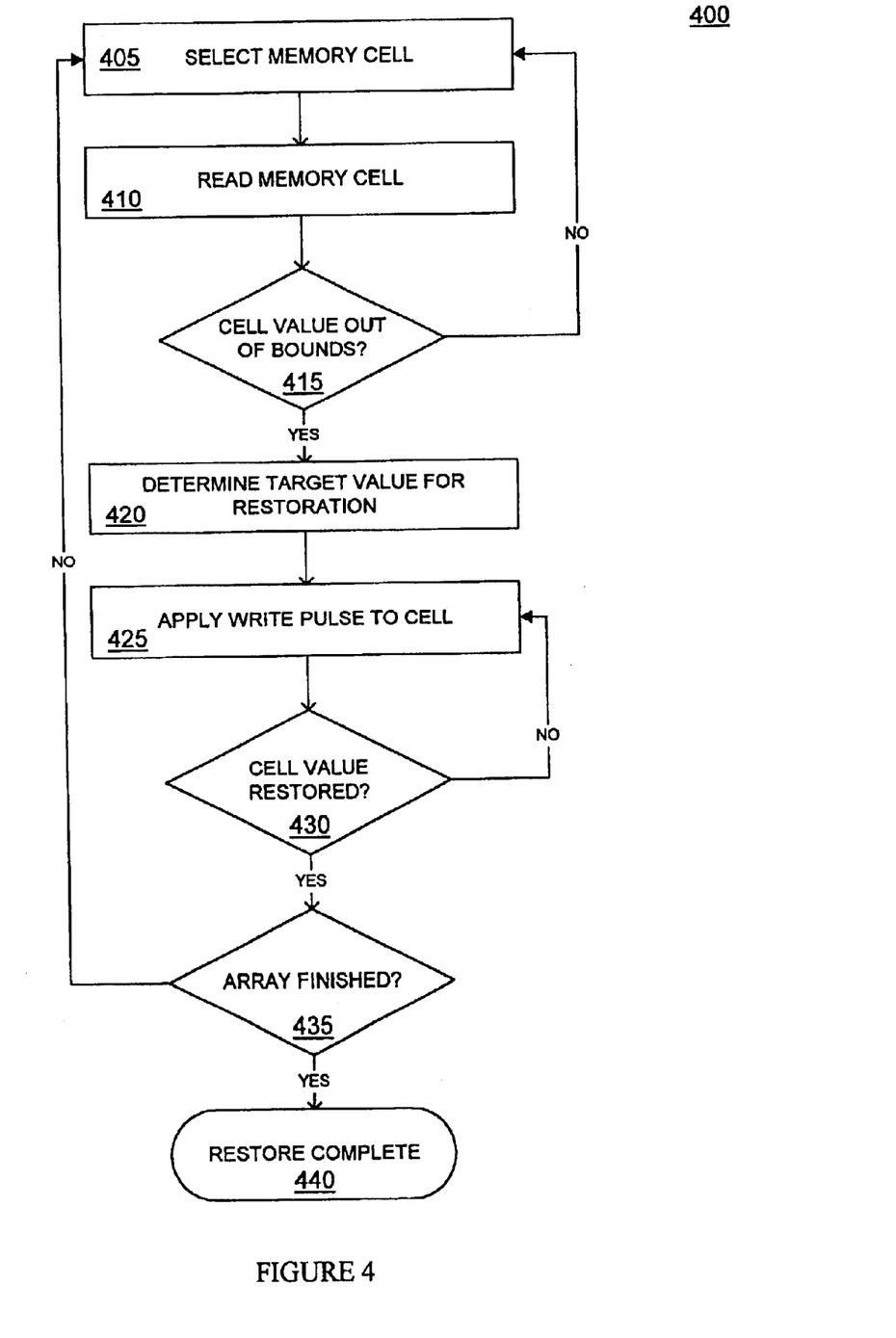
FIG. 4 shows a flow chart diagram for charge restoration in a non-volatile memory device in accordance with a method embodiment of the present claimed invention.

FIG. 4 shows a flow chart diagram 400 of a method embodiment of the present invention for restoring charge in a non-volatile memory device and preserving the read margin between logical values in a non-volatile memory device. In step 405, a memory cell that is accessible by normal programming is selected from a memory cell array (e.g., a sector) in the device. The selection may be done using the same X and Y decoders that are used for reading and writing to the memory cell array. In step 410, the selected memory cell is read to obtain a read value. The reading of the memory cell may be done using the same read circuit that is used for conventional reading of a memory cell.

In step 415, the read value obtained in step 410 is compared to one or more boundary values to determine whether or not the memory cell has drifted into a read margin. It should be noted that a determination that a margin boundary has been crossed does not necessarily determine which margin boundary has been crossed. Although the left shift shown in the specific example of FIG. 3A creates a situation in which the read margin is entered from the right, this may not hold in general. Depending upon the nature of the memory cell and its programming, different criteria may be used to determine the boundary that has been violated.

When steps 405 and 410 are performed frequently, or there is no significant lateral distribution shift anticipated, the criterion for determining a violated margin boundary may be to choose the margin boundary closest to the read value. This criterion may also be used when the anticipated lateral distribution shift is small compared to the accuracy tolerance of the read circuit. However, when a significant lateral shift in the distribution is anticipated, the upper or lower margin boundary may be assumed for all margins. If the read value for the selected memory cell does not fall within a read margin, then steps 405 and 410 may be repeated.

If the read value determined in step 410 falls within a margin and it is determined in step 415 that the memory cell value is out of bounds, step 420 is executed and a target value for restoration is determined. The target restoration value is the threshold voltage value to which the cell is to be programmed in order to "push" the memory cell value back across the margin boundary that was crossed. The target value may simply be the threshold voltage associated with the margin boundary that was crossed, or it may be a value that falls within the threshold voltage distribution associated with the crossed margin boundary. For example, a memory cell with a read value that is determined to have crossed $V_{B2}$ in FIG. 3A may have a target value selected from any threshold voltage within distribution 220.

In addition to the minimum and maximum values of a distribution, there are a number of statistical measures that may be used to establish a target value. Among these are the mean and median. The target values may be fixed a priori and not changed during the life of the non-volatile memory device, or they may be based upon empirical data obtained from an memory cell array during the operation of the device. Dynamic target values are useful when the degradation of the basic memory cell makes it difficult to program to the initial threshold voltage values late in the life of the device.

Over time, the restoration cycle period may have to be shortened considerably in order to maintain initial margin boundaries and target values. In order to avoid a high restoration cycle rate, the margin boundaries and target values may be adjusted over the life of the device. These dynamic margin boundaries and target values may be obtained by periodic statistical analysis of the memory cell during the operational life of the device.

Referring again to FIG. 4, in step 425, one or more write pulses is applied to the memory cell. There are many different methods for performing a write/verify operation on a non-volatile memory cell. U.S. Pat. No. 6,343,033, "Variable Pulse Width Memory Programming," (issued Jan. 29, 2002) and U.S. Pat. No. 6,424,569, "User Selectable Cell Programming," (issued Jul. 23, 2002), are assigned to the assignee of the present invention and discuss methods for programming a memory cell. Both patents are hereby incorporated herein by reference.

The application of a write pulse to the selected memory cell may be done by issuing a call to an existing on-chip routine used for normal programming operations (write/verify), or may be done by direct control of the write and read circuits that are used for normal programming and reading. Alternatively, non-volatile memory device may include dedicated read and write circuits that are used exclusively for applying charge restoration write pulses to a memory cell.

In step 430, the memory cell value is read and compared to the target value to determine whether the cell has been restored. In general, the cell is restored when the read value does not fall within a read margin. If the cell value is determined as restored in step 430, step 435 is executed. If the cell value has not been restored, step 425 is repeated. Subsequent to the application of a write pulse using a specific target value, the target value may not be used to determine the success of the write operation. The write operation may be considered successful if the read margin has been cleared (e.g., the read value is back on the other side of the margin boundary). Alternatively, in order to extend the period between charge restoration operations, the successful restoration may depend upon achieving the target value within a specified tolerance. In this case, the repetition of step 425 may be required even though the read value is not in a read margin.

In step 435, a check is made to see if all of the normally programmable memory cells in the array have been evaluated. If not all of the cells in the group have been evaluated, step 405 is repeated. If all cell have been evaluated, the restore operation is complete at step 440. Steps 405 to 440 may be repeated after a finite period of time that may be adjustable. When adjustable, the period between restore operations may be based upon a prior statistical analysis of the memory cell array.

Figure 5:
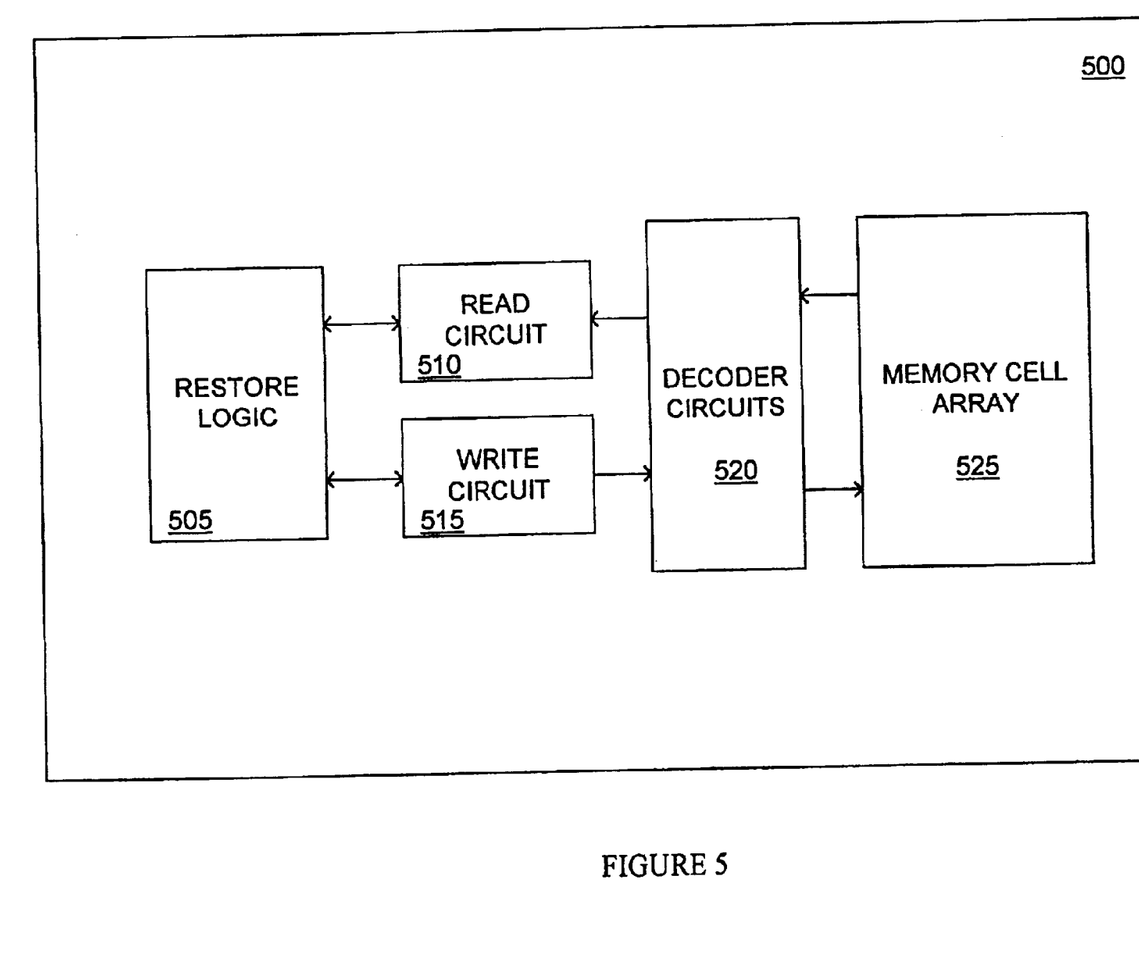
FIG. 5 shows a diagram of a non-volatile memory device comprising restore logic in accordance with an embodiment of the present claimed invention.

FIG. 5 shows a diagram of a non-volatile memory device 500 comprising restore logic 505 in accordance with an embodiment of the present claimed invention. The restore logic 505 is coupled to a read circuit 510 and a write circuit 515. The coupling may allow for direct control of the read circuit 510 and write circuit 515 so that their functions may be controlled at the most basic level, or the restore logic may be coupled by intervening logic that provides a set of high level functions that may be called by the restore logic. For example, the writing of a charge restoration pulse may be accomplished by a call to an embedded algorithm that is used in normal programming of a memory cell.

The restore logic may include a processor for performing a statistical analysis on the memory cell array 525. This analysis may be used to monitor the degradation of charge retention in the memory cell array and serve as a basis for the determination of read margin boundaries and restoration target values.

The read circuit 510 is typically the same read circuit that is used for normal read and verify operations performed when writing to, or reading from the non-volatile memory device. Alternatively, the read circuit may be a dedicated circuit that is used only for charge restoration.

The write circuit 515 is typically the same circuit that is used for normal write operations performed when writing to, or reading from the non-volatile memory device. Alternatively the write circuit may be a dedicated circuit that is used only for charge restoration. The write circuit may use Fowler-Nordheim tunneling or channel hot electron injection for restoring charge during a write operation.

The read circuit 510 and write circuit 515 are connected to decoder circuits for selecting a memory cell from the memory cell array 525 for evaluation and restoration as needed. The decoder circuits may be the X-decoder and Y-decoder circuits that are used to address memory cells during normal read and write operations.

The memory cell array 525 comprises a block of memory cells used for the storage and retrieval of data from sources that external to the non-volatile memory device 500. The memory cell array may also comprise additional cells such as reference cells, redundancy cells, dummy cells, and reserved cells. Reserved cells are cells that are only written to by the restore logic. By limiting the writing access to the reserved cells, the reserved cells are protected from high cycle degradation. This allows the restore logic 505 to store statistical and other data in memory cells that are more reliable than the general purpose memory cells in the array that may experience many cycles. Data stored in the reserved cells may be accessible to applications external to the non-volatile memory device (e.g., diagnostic programs).

While the present invention of a system and method for charge restoration in a non-volatile memory device has been described in particular embodiments, it should be appreciated that the present invention should not be construed as limited by such embodiments, but rather construed according to the below claims.

What is claimed is:

1. A method for restoring charge in a non-volatile memory device comprising:
   selecting a programmed memory cell from a memory cell array;
   reading said memory cell to obtain a cell value;
   comparing said memory cell to a boundary value, wherein said boundary value is related to the distribution of threshold voltages for a population to which said memory cell belongs;
   determining whether the cell value is out of bounds;
   determining a target value for restoration; and
   applying a write pulse to said memory cell.

2. The method of claim 1, further comprising a repetition of said selecting, reading, determining and applying steps.

3. The method of claim 2, further comprising a repetition of said determining and applying steps.

4. The method of claim 1, wherein said target value is equal to said boundary value.

5. The method of claim 1, wherein said target value is derived from a statistical analysis of said memory cell array.

6. The method of claim 5, wherein said target value is a mean value.

7. The method of claim 1, wherein said applying a write pulse to said memory cell comprises channel hot electron injection.

8. The method of claim 1, wherein said applying a write pulse to said memory cell comprises Fowler-Nordheim tunneling.

9. The method of claim 1, wherein said memory cell comprises a floating gate.

10. The method of claim 1, wherein said memory cell is a multi-level memory cell.

11. A non-volatile memory device comprising:
    a memory cell array comprising a plurality of memory cells;
    decoder circuits coupled to said memory cell array for selecting a memory cell belonging to said memory cell array;
    a read circuit coupled to said decoder circuits for determining a value for the selected memory cell;
    a write circuit coupled to said decoder circuits for restoring charge to said memory cell; and
    restore logic coupled to said read circuit and to said write circuit for controlling said read circuit and said write circuit, and for comparing a read value to a boundary value that is related to the distribution of threshold voltages for a population of memory cells to which said memory cell belongs.

12. The non-volatile memory device of claim 11, further comprising a floating gate.

13. The non-volatile memory device of claim 11, further comprising a dielectric charge storage element.

14. The non-volatile memory device of claim 11, wherein said restore logic comprises a processor for performing a statistical analysis on said memory cell array.

15. The non-volatile memory device of claim 11, wherein said write circuit is used for normal programming of said memory cell array and charge restoration in said memory cell array.

16. The non-volatile memory device of claim 11, wherein said write circuit uses channel hot electron injection for charge restoration.

17. The non-volatile memory device of claim 11, wherein said write circuit uses Fowler-Nordheim tunneling for charge restoration.

18. The non-volatile memory device of claim 11, wherein memory cell array comprises a plurality of multi-level memory cells.

19. The non-volatile memory device of claim 11, wherein said memory cell array comprises at least one memory cell reserved for use by said restore logic.

20. The non-volatile memory device of claim 11, wherein said memory device comprises a programming write circuit and a dedicated restoration write circuit.

* * * * *